US006790334B2

(12) United States Patent
Begum et al.

(10) Patent No.: US 6,790,334 B2
(45) Date of Patent: Sep. 14, 2004

(54) COMBINED ADHESION PROMOTION AND DIRECT METALLIZATION PROCESS

(75) Inventors: Zatoon Begum, Coventry (GB); Martin T. Goosey, Nuneaton (GB); John E. Graves, Nuneaton (GB); Mark A. Poole, Bilton Rugby (GB); Amrik Singh, Coventry (GB)

(73) Assignee: Shipley Company, L.L.C., Marlborough, MA (US)

( * ) Notice: Subject to any disclaimer, the term of this patent is extended or adjusted under 35 U.S.C. 154(b) by 102 days.

(21) Appl. No.: 10/210,535

(22) Filed: Aug. 2, 2002

(65) Prior Publication Data

US 2003/0047458 A1 Mar. 13, 2003

(30) Foreign Application Priority Data

Aug. 2, 2001 (GB) .............................................. 0118870

(51) Int. Cl.[7] .............................. C25D 5/54; C25D 5/56; C25D 5/34
(52) U.S. Cl. ....................... 205/159; 205/161; 205/164; 205/166; 205/210
(58) Field of Search ............................... 205/161, 162, 205/163, 164, 166, 210, 159

(56) References Cited

U.S. PATENT DOCUMENTS

| | | | |
|---|---|---|---|
| 3,523,875 A | * 8/1970 | Minklei | 205/184 |
| 3,993,491 A | 11/1976 | Feldstein | 106/1 |
| 3,993,799 A | 11/1976 | Feldstein | 427/53 |
| 4,457,951 A | 7/1984 | D'Amico et al. | 427/96 |
| 4,568,570 A | 2/1986 | Giesecke | 427/304 |
| 4,810,333 A | 3/1989 | Gulla et al. | 205/15 |
| 4,917,761 A | * 4/1990 | Keep | 216/83 |
| 4,919,768 A | 4/1990 | Bladon | 205/15 |
| 5,007,990 A | 4/1991 | Bladon | 204/15 |
| 5,100,633 A | 3/1992 | Morrison | 423/225 |
| 5,178,956 A | 1/1993 | Rychwalski et al. | 428/458 |
| 5,192,590 A | 3/1993 | Sherman | 427/304 |
| 5,238,550 A | 8/1993 | Burress | 205/187 |
| 5,626,736 A | 5/1997 | Florio et al. | 205/125 |
| 5,648,125 A | 7/1997 | Cane | 427/534 |
| 5,911,868 A | 6/1999 | Balazs et al. | 205/688 |

FOREIGN PATENT DOCUMENTS

| | | |
|---|---|---|
| EP | 0 297 738 B1 | 3/1992 |
| EP | 0 913 498 A1 | 5/1999 |
| WO | WO 00/29646 | 5/2000 |
| WO | WO 00/29646 A1 * | 5/2000 |

* cited by examiner

Primary Examiner—Edna Wong
(74) Attorney, Agent, or Firm—John J. Piskorski

(57) ABSTRACT

A combined adhesion promotion method of a metal to a non-conductive substrate and directly metallizing the non-conductive substrate with the metal. The method involves texturing a non-conductive substrate with a cobalt etch followed by applying a sulfide to the textured non-conductive substrate to provide an electrically conductive surface on the non-conductive substrate. After the surface of the non-conductive substrate has been made electrically conductive, the surface of the non-conductive substrate can be directly metallized. The method reduces the number of process steps for direct metallization of a non-conductive substrate. Thus, the method is more efficient in contrast to conventional methods of metallizing a non-conductive substrate.

20 Claims, 1 Drawing Sheet

COMBINED ADHESION PROMOTION AND DIRECT METALLIZATION PROCESS

BACKGROUND OF THE INVENTION

The present invention is directed to a combined adhesion promotion and direct metallization process for non-conductive substrates. More specifically, the present invention is directed to a combined adhesion promotion and direct metallization process for non-conductive substrates employing a cobalt etch to both improve adhesion between non-conductive surfaces and a plated metal and to improve the direct metallization process.

Non-conductive surfaces may be metallized by a sequence of steps consisting of catalysis of the surface of the non-conductor followed by contact of the catalyzed surface with an electroless plating solution that deposits metal over the catalyzed surface in the absence of an external source of electricity. Following electroless metal deposition, the electroless metal deposit is optionally enhanced by electrodeposition of a metal coating to a desired full thickness.

Catalyst compositions used for electroless metal plating are known in the art and disclosed in numerous publications such as in U.S. Pat. No. 4,734,299. The catalysts of the patent consist of an aqueous suspension of a tin-noble or precious (catalytic) metal colloids such as tin/palladium. Electroless plating solutions are aqueous solutions containing dissolved metal and reducing agent in solution. However, the presence of dissolved metal and reducing agent together in solution results in solution instability and plate out of metal in contact with a catalytic metal-tin catalyst on the walls of containers. To prevent the plate out of metal on the walls of containers, stabilizers such as toxic cyanide compounds are included in the solutions. Such compounds impose a hazard to workers in the art. Also environmentally undesirable complexing agents and chelating agents such as ethylenediamine-tetraacetic acid (EDTA) are employed to keep copper in solution in strongly alkaline media. Additionally, reducing agents such as formaldehyde are known carcinogens and are desirably substituted with boron or another type of reducing agent. However, substitutes such as the boron reducing agents are costly in contrast to formaldehyde which is considerably more cost effective.

Electroless plating processes involve a relatively large number of steps resulting in undesirably high processing times and water consumption. In addition to the problems associated with the combination of dissolved metal and reducing agent in the same solution, and the large number of steps, the use of noble or precious metals such as palladium in metal colloids adds to the cost of the electroless processes. Such disadvantages have spurred the search for methods that provide viable alternatives to electroless depositon methods.

EP 0 913,498 A1 provides an improvement over the electroless plating method of U.S. Pat. No. 4,734,299. EP 0 913,498 A1 discloses an electroless plating method where costly noble metals such as palladium need not be employed in catalytic metal colloids. Thus, the process is less costly. EP 0 913,498 A1 employs metal activators such as silver, cobalt, ruthenium, cerium, iron, manganese, nickel, rhodium and vanadium. The metal activators are applied to a non-conductive surface as salts such as sulfate salts in aqueous sulfuric acid solution, nitrate salts in nitric acid solution, fluoroborate salts in aqueous fluoroboric acid solution and the like. The metal activators provide a roughened surface on the non-conductive substrate without the need for harsh conditioning agents such as chromic acid and permanganate.

In use, the metal activators are oxidized to a higher state (e.g. to $Ag^{2+}$ or to $Co^{3+}$) electrochemically. Workers in the art believe that the oxidized metal activator generates reactive hydroxyl species from water, such as hydroxyl radicals. The hydroxyl species are very reactive and attack the non-conductive surfaces, particularly organic polymers, to provide an ideal pitted or roughened morphology deemed desirable for subsequent metal adhesion. Following surface texturing, the non-conductive substrate is immersed in a reducing agent pre-dip solution. The substrate is then immediately plated by immersion into an electroless metal plating solution such as a copper bath without any further process steps. Examples of reducing agents employed in the process include formaldehyde, boron based reagents such as dimethylamineborane, boron hydride or salts thereof (e.g. sodium borohydride), sodium dithionite, or sodium hypophosphite.

Another advantage of the method is that the metal activators, such as silver and cobalt, may be regenerated by electrochemical methods thus reducing problems encountered with waste treatment. As mentioned above, EP 0 913,498 A1 also has the advantage that the process disclosed therein does not employ a chromic acid etch as many electroless plating processes utilize. An example of a chromic acid etch may be found in U.S. Pat. No. 4,457,951. Chromic acid etch methods are undesirable because chromic acid may be a carcinogen, and also presents various waste treatment, disposal problems and environmental concerns. Accordingly, there is a great interest in the development of alternative methods of metallization that do not utilize chromic acid.

Although the electroless plating method disclosed in the EP 0 913,498 A1 patent is a very good electroless plating method for the reasons just discussed, the method still employs many reducing agents that are undesirable for the reasons discussed earlier, and an electroless plating step. Electroless plating steps increase the time over which the plating process is performed in contrast to direct electroplating, thus reducing the efficiency of the plating process. Other disadvantages include more complex and expensive waste treatment procedures, greater environmental impact and greater water consumption than direct metallization processes.

Attempts have been made to avoid electroless plating processes by a direct metal plating process whereby a metal is deposited directly over a treated non-conductive surface. U.S. Pat. No. 5,007,990 discloses a method for direct electroplating the surface of a non-conductor and to articles manufactured by the process. The invention disclosed in the patent is based upon a combination of discoveries. One discovery was that chalcogenide films of metals that function as electroless deposition catalysts may be electroplated directly without requiring an intermediate electroless coating. Another discovery of the invention was that many of such chalcogenide films are insoluble and unaffected by treatment chemicals used for plating of plastics and circuit board fabrication and therefore, the process of the invention was suitable for the formation of printed circuits using pattern plating processes.

In the process of U.S. Pat. No. 5,007,990, the electroless metal plating catalysts are believed to be colloids formed by the reaction of stannous salt and a noble metal salt such as palladium with a chalcogenide. Other metals that may be employed include copper, nickel, cobalt and the like. However such non-noble metals are lesser preferred than palladium. Non-noble metals such as cobalt are less catalytic than palladium. Solutions for the formation of chalcogenide films may be thio compounds and divalent sulfide solutions. Alkaline earth metal sulfide salts provide the source of the sulfide. Such salts include sodium, potassium and lithium sulfides. Accordingly, preferred coatings for direct electroplating are believed to be films of mixed sulfide or palladium and tin.

Although U.S. Pat. No. 5,007,990 is an improvement in plating a non-conductive substrate by eliminating the electroless step from the process, the process preferably employs costly palladium metal over less costly metals such as copper, nickel, or cobalt. Additionally, when employing the process in the manufacture of printed circuit boards, board through-holes are desmeared by sulfuric acid, chromic acid or plasma etching or etchback of the holes with chromic acid prior to applying the process of the '990 patent. As discussed above, chromic acid steps are undesirable. Also use of sulfuric acid in its etching concentrations may present hazards to workers. Sulfuric acid may cause severe burns to workers and may cause corrosion of metal parts on printed circuit boards.

WO 00/29646 discloses a method of treating a non-conductive surface for metallization. The method involves etching a non-conductive surface, such as a plastic surface, with an oxidizing agent to roughen the non-conductive surface. Such etching materials include permanganate, chromic acid, hydrogen peroxide, and the like. After the plastic surface is roughened, the surface is treated with a cobalt salt, silver salt, tin salt or lead salt. Preferably, following treatment of the plastic with the metal salt, the plastic is treated with an aqueous alkaline solution at a pH of from 9 to 14. Alternatively, the plastic can be treated with an acid solution. Such treatment is employed when cobalt sulfate is used as the metal salt as taught in the examples at the end of the patent. The plastic surface then is treated with an alkali metal sulfide such as a monosulfide, disulfide, tetrasulfide or polysulfide. For example, sodium sulfide ($Na_2S$) may be employed. After applying the sulfide solution, the plastic is plated by a direct plating method.

Although WO 00/29646 eliminates the use of a costly metal as palladium, as well as an electroless plating step, the method employs an etching method employing chromic acid, permanganate or other acid or highly basic oxidizing agents that may present a hazard to workers or to the environment. Further, when cobalt salts are employed, as disclosed in the examples in the patent, an additional step of treating the plastic with an acid or alkaline dip is employed. Accordingly, there is still a need for a more efficient direct metallization method that eliminates both harsh oxidation steps to roughen non-conductive substrates, the use of costly noble metal catalysts, and electroless plating steps.

SUMMARY OF THE INVENTION

The present invention is directed to a combined process for improving the adhesion of a metal to a non-conductive substrate and direct metallization of the non-conductive substrate by texturing the non-conductive substrate with a cobalt etch and treating the textured non-conductive substrate with a sulfide to provide a conductive surface or layer. Advantageously, etching a non-conductive substrate with a cobalt etch texturizes the non-conductive substrate to provide a sufficiently roughened surface such that a metal deposited on the textured surface forms a bond of high integrity with the substrate. Further, the treatment of the cobalt etched non-conductive substrate with a sulfide provides a conductive cobalt sulfide species such that a metal can be directly plated on a now conductive surface of the non-conductive substrate.

Advantageously, the method of the present invention provides for an efficient method of texturing a non-conductive substrate and activating the non-conductive substrate to receive a metal deposit. The method of the present invention eliminates the steps of electroless plating as well as texturing the non-conductive substrate with an oxidizer such as hydrogen peroxide, chromic acid, permanganate and the like. The cobalt etch is sufficient to provide a textured surface on the non-conductive substrate without the use of an oxidizer. The method of the present invention also eliminates the use of undesirable reducing agents such as formaldehyde and boron compounds, and costly noble metal catalysts such as tin/palladium catalysts. Thus the method of the present invention not only provides a shorter and more efficient direct metallization process, but the process also eliminates the numerous problems associated with other metal plating methods.

Another advantage of the method of the present invention is that the method may be employed in both horizontal and vertical methods of manufacturing printed circuit and wiring boards. The method of the present invention is short, thus being highly suitable for horizontal circuit board manufacturing processes.

Horizontal methods are a highly desirable methods of preparing printed wiring boards because the process is more rapid than the vertical method, thus out-put is greater. Horizontal methods are more costly than vertical methods, because of the equipment employed, thus reducing the time of operation is highly desirable. The reduced number of method steps of the present invention to both texture and provide a conductive surface on the non-conductive substrate is highly desirable for horizontal methods.

A primary objective of the present invention is to provide for a method of texturing and providing a conductive surface on a non-conductive substrate such that the substrate can be directly metallized.

Another objective of the present invention is to provide a method for texturing a non-conductive surface without the use of oxidizing agents.

An additional objective of the present invention is to provide a method of direct metallization without an electroless plating step.

Still yet an additional objective of the present invention is to provide a method of direct metallization that does not employ noble metal catalysts.

Further objectives and advantages of the present invention may be determined by a person of skill in the art after reading the detailed description of the invention and the appended claims.

DETAILED DESCRIPTION OF THE INVENTION

Figure 1:
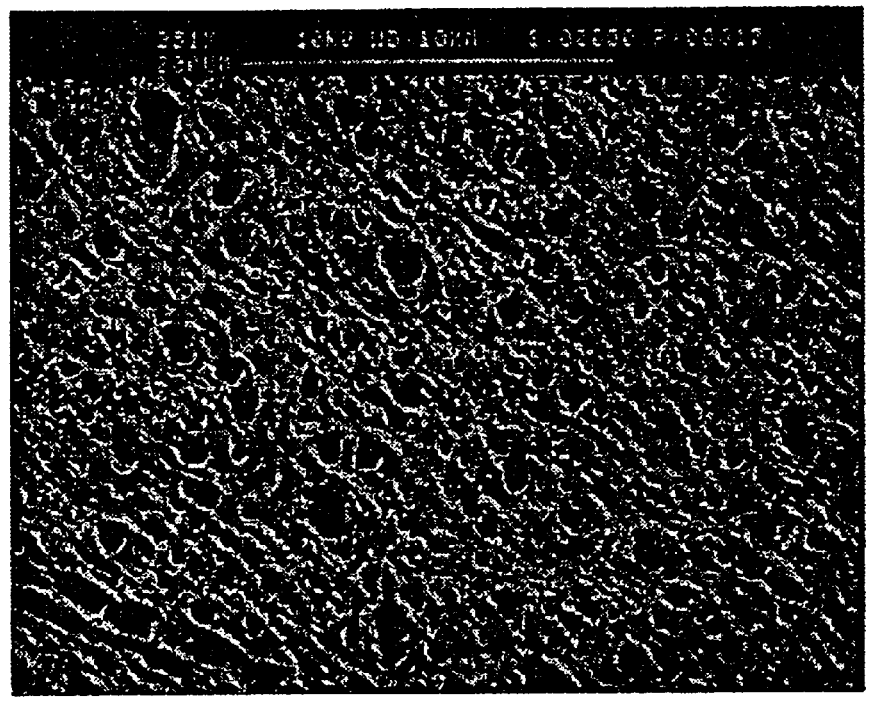
FIG. 1 is a scanning electron micrograph (SEM) at 2000× of acrylonitrile-butadiene-styrene copolymer textured with an etching solution composed of cobalt sulfate in 1 M sulfuric acid.

The present invention provides a combined adhesion and direct metallization method of a surface or layer of a non-conductive substrate by texturing a non-conductive substrate with a cobalt etch followed by treating the textured non-conductive substrate with a sulfide to provide a conductive surface or layer. Suprisingly, etching the non-conductive substrate with a cobalt salt solution without prior treatment of the non-conductive surface sufficiently roughens or texturizes the non-conductive surface to form a strong bond with a deposited metal. The roughened or textured non-conductive surface or layer is chemically and physically modified by the cobalt etch such that the surface is optimized for receiving a metal layer. The textured surface provides pores or micro-openings for both retaining cobalt ions that form a conductive species and a means for deposited metal to grasp onto to form a bond of high integrity. Application of the sulfide to the textured non-conductive substrate results in the formation of a conductive cobalt sulfide species that provides the non-conductive substrate with a conductive surface that can be directly metallized.

All numerical ranges are inclusive and combinable. The cobalt etch step is performed over about 5 minutes to about 60 minutes, preferably from about 15 minutes to about 30 minutes. The cobalt etch is an aqueous solution containing any suitable cobalt (II) salt that is soluble in water. Examples of suitable cobalt (II) salts include, but are not limited to, cobalt halides, sulfates, nitrates, phosphates, and tetrafluoroborates. Such aqueous cobalt etch solutions are acidic, and may be acidified with sulfuric, nitric tetrafluoroboric, phosphoric acid or any combination thereof. Cobalt in solution is in the form of $Co^{2+}$ ions which are then oxidized electrochemically to give $Co^{3+}$ ions. Thus, the etch solution contains a mixture of both $Co^{2+}$ and $Co^{3+}$ ions in amounts of from about 5 g/L to about 120 g/L, preferably from about 40 g/L to about 80 g/L. Most preferably, the $Co^{2+}$ and $Co^{3+}$ ions range from about 50 g/L to about 70 g/L in solution. Acid concentration ranges from about 0.1 $mol/dm^3$ to about 10.0 $mol/dm^3$, preferably from about 0.5 $mol/dm^3$ to about 2.0 $mol/dm^3$. Such solutions have a pH of below 1. Typically electrochemical oxidation is carried out using an inert electrode such as platinum, platinized titanium, platinum on niobium or tantalum, ruthenium or iridium dioxide on titanium, or glassy carbon at a current density of about 1 $mA/cm^2$ to about 10 $A/cm^2$, preferably from about 10 $mA/cm^2$ to about 100 $mA/cm^2$. The preparation is carried out in an undivided cell.

Preferably, but optionally, prior to texturing the non-conductive substrate with the cobalt etch, the non-conductive substrate is made hydrophilic with any suitable neutral pH conditioner or solvent swell. The pH of the conditioner or solvent swell may range from about 6.5 to less than about 8.0, preferably the pH of the conditioner or solvent swell ranges from about 7.0 to about 7.5. Conditioners or solvent swells are applied on the non-conductive substrate for about 1 minute to about 15 minutes, preferably from about 2 minutes to about 10 minutes. Optionally, the conditioned or solvent swell treated non-conductive substrate may be rinsed with water before applying the cobalt etch. The aqueous rinse step is performed for about 0.5 minutes to about 5 minutes, preferably from about 1 minute to about 3 minutes.

Any suitable conditioner that has the specified pH ranges art may be used to practice the present invention. Examples of suitable conditioners include, but are not limited to, propylene carbonate, butyrolactone, or mixtures thereof. A preferred conditioner contains gamma butyrolactone, propylene carbonate, a non-ionic polyoxypropylene surfactant, and a phosphate ester surfactant. Representative solvent swells that may be employed to condition the non-conductive substrate include, but are not limited to, ketone and lactone containing solvent swells. An example of a ketone solvent swell contains methyl ethyl ketone in combination with gamma butyrolactone or propylene carbonate.

Other suitable solvent swells that may be employed to practice the present invention include, but are not limited to, solvent swells containing glycols and glycol ethers, lactones such as gamma-caprolactone, epsilon-caprolactone, gamma-valerolactone and derivatives thereof. Also included are solvent swells containing heterocyclic nitrogen compounds such as N-methyl-2-pyrrolidone, 2-pyrrolidone, N-ethyl-2-pyrrolidone, N-cyclohexyl-2-pyrrolidone, N-dodecyl-2-pyrrolidone, N-(2-hydroxyethyl)-2-pyrrolidone, dimethylacetamide, and the like. The solvent swells employed also may contain combinations of the above-mentioned conditioner or solvent swell components.

Conditioner and solvent swell compositions are aqueous based and contain from about 10% by volume to about 70% by volume of the foregoing listed active components. Preferably, the active components of the conditioners and solvent swells range from about 20% by volume to about 40% by volume.

FIG. 1 shows a SEM at about 2000× of acrylonitrile-butadiene-styrene copolymer treated with a conditioner composed of a mixture of propylene carbonate and butyrolactone followed by etching with an aqueous solution of cobalt sulfate in 1 M sulfuric acid. The copolymer was first treated with the conditioner for about 5 minutes at about 40° C., rinsed with water and then etched with the cobalt composition for about 15 minutes at about 35° C. A current of about 0.2 amps (A) was passed through the etching solution during treatment. The SEM shows that the cobalt etching solution formed a highly porous or highly textured surface on the copolymer. Such high porosity or texturing provides for a surface where a directly electroplated metal can penetrate deep into the copolymer surface to form a uniform metal layer with a strong bond with the copolymer.

Figure 2:
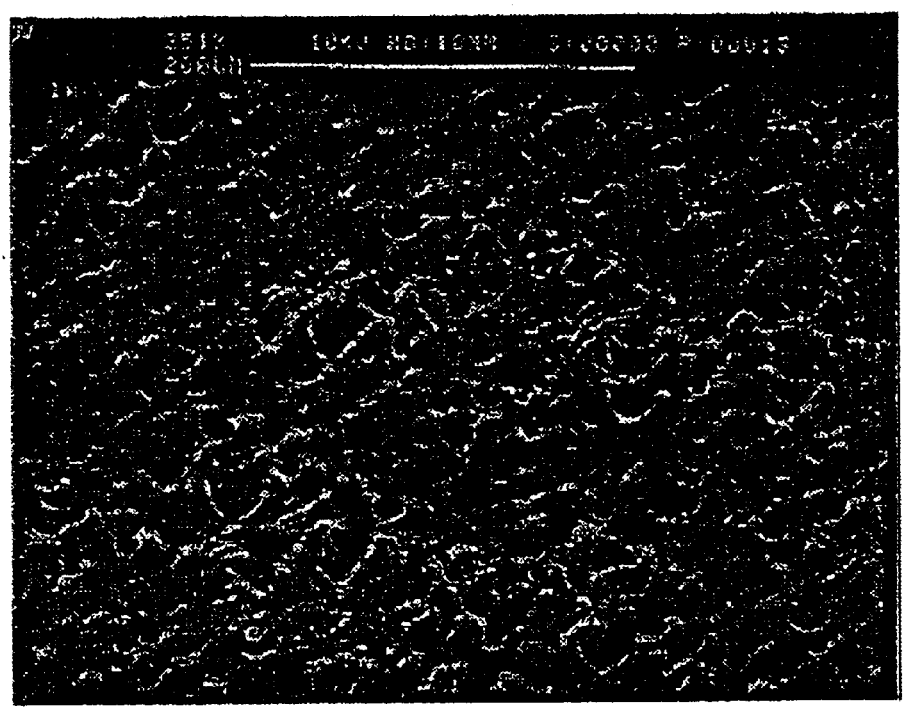
FIG. 2 is a scanning electron micrograph (SEM) at 2000× of acrylonitrile-butadiene-styrene copolymer textured with an etching solution composed of cobalt phosphate in 2.4 M phosphoric acid.

FIG. 2 also shows a SEM at about 2000× of acrylonitrile-butadiene-styrene copolymer treated with a propylene carbonate and butyrolactone conditioner followed by etching with an aqueous solution of cobalt phosphate in 2.4 M phosphoric acid. The copolymer was first treated with the conditioner for about 5 minutes at about 38° C., then rinsed with water followed by treating the copolymer with the cobalt etch solution for about 30 minutes at 35° C. A current of about 0.2 amps was passed through the etching solution during treatment. The SEM shows high porosity on the copolymer surface such that a uniform metal layer directly electroplated on the copolymer can form a metal-polymer bond of high integrity. Porous within the scope of the present invention means a surface or layer of a substrate penetrated by small open spaces. Porosity within the scope of the present invention means a state of a solid body or substrate penetrated by minute open spaces filled with liquid or gas.

After application of the cobalt etch, the non-conductive substrate optionally may be rinsed with cold water. The aqueous rinse step is performed for about 0.5 minutes to 5 minutes, preferably from about 1 minute to about 3 minutes. Preferably, the etched non-conductive substrate is treated with the sulfide to form an electrically conductive cobalt sulfide species. The cobalt ions that are retained in the pores of the textured non-conductive substrate form the conductive sulfide species throughout the textured surface of the non-conductive substrate. The sulfide treatment step is from about 30 seconds to about 10 minutes, preferably from about 2 minutes to about 5 minutes. Any suitable sulfide that provides sulfide such that the cobalt sulfide conductive species is formed may be employed. Preferably, the sulfide is provided as an aqueous alkaline solution. The sulfide may be a monosulfide, disulfide, tetrasulfide or a polysulfide. Preferably, an alkali metal sulfide ($M_2S$, M=alkali metal) is used. Examples of suitable alkali metals include sodium, potassium, lithium and the like. Sodium sulfide ($Na_2S$) is the most preferred alkali metal sulfide. The sulfide solution contains from about 0.25 g/L to about 10 g/L of sulfide, preferably from about 0.5 g/L to about 5 g/L of sulfide.

Any suitable base may be included in the sulfide solution to maintain an alkaline pH of from about 7.5 to about 10.0. Preferably, the pH of the sulfide solution has a mild pH range of from about 8.0 to about 9.0. Suitable alkaline compounds that may be added to the sulfide solution to provide the appropriate pH include, but are not limited to, sodium hydroxide, potassium hydroxide, sodium carbonate, sodium bicarbonate, or mixtures thereof. The alkaline or basic compounds range in amounts of from about 0.5 g/L to about 5.0 g/L of solution. Preferably, the alkaline or basic compounds range from about 1.0 g/L to about 4.0 g/L of solution.

Preferably, dithionites (hyposulfites) having the general formula $M_2S_2O_4$ (M=an alkali metal such as sodium, potassium or lithium) are employed with the sulfide treatment step. When dithionites are employed, they are used in amounts of from about 1.0 g/L to about 15 g/L, preferably from about 5 g/L to about 10 g/L. While not being bound to any particular theory, the inventors believe that dithionites may also form sulfides with cobalt.

The cobalt etch and sulfide may be applied to the non-conductive substrate by any suitable means employed in the art. For example, the non-conductive substrate may be dipped into a vessel containing the cobalt etch and sulfide, or the cobalt etch and sulfide may be sprayed onto the non-conductive substrate. The non-conductive substrate may be treated with the cobalt etch and sulfide by any combination of dipping or spraying.

After the sulfide treatment, a surface of the non-conductive substrate becomes conductive with the cobalt sulfide species. The now conductive and textured substrate may be directly metallized by any suitable direct electroplating procedure employed in the art. Optionally, the conductive substrate may be rinsed with water. The time period for rinsing with water is as disclosed above. Temperature ranges employed in the method steps of the present invention range from about 20° C. to about 40° C.

Non-conductive substrates treated by the method of the present invention may be directly plated with any suitable metal that can be directly plated on a substrate. Examples of such metals include, but are not limited to, copper, nickel, tin, lead, iron, gold, silver, platinum, palladium, tantalum, cobalt, ruthenium, indium, bismuth, antimony, rhodium, vanadium, zinc, or alloys thereof.

As disclosed above, any suitable direct electroplating procedure may be employed to directly metallize a treated substrate. Electroplating processes for directly metallizing the treated substrate may employ any suitable electroplating solution. Commercially available electroplating solutions may be employed. Commercially available electroplating solutions contain additives that make such solutions suitable for practicing the present invention. Although many metals may be electroplated on substrates treated with the method of the present invention, preferred electroplating metals consist of copper and nickel. An example of an electroplating solution contains an aqueous acid solution of the metal desired to be plated together with proprietary additives from the group of dyes, surfactants, chelating agents, brighteners, leveling agents, suppressors and the like. Acids that may be used in the formulation of electroplating baths contain those with a high ionic dissociation constant for maximum conductivity such as sulfuric acid, fluoroboric acid, sulfamic acid and the like. Dyes that may be employed include methylene blue, methyl violet, and other N-heterocyclic compounds; triphenylmethane type dyes and aromatic imines and diazo compounds. Suitable surfactants included in such electroplating baths include non-ionic surfactants such as alkyphenoxy polyethoxyethanols, such as octophenoxy, polyethoxyethanol, and the like. Surfactants include wetting agents and water soluble organic compounds such as compounds containing multiple oxyethylene groups. A preferred group of such compounds include polyoxyethylene polymers having from as many as 20 to 150 repeating units. Also included in this class of materials are block copolymers or polyoxyethylene and polyoxypropylene. The additives described above are added to solution in conventional amounts.

Substrates that are to be plated are employed as the cathode in electroplating cells. Any suitable anode may be employed in the electroplating cell apparatus, i.e., soluble or insoluble anodes. Current density may range from about 10 amps per $ft^2$ to about 40 amps per $ft^2$, preferably from about 15 amps per $ft^2$ to about 30 amps per $ft^2$. The electroplating solution is maintained at a temperature of from about 20° C. to about 40° C. Electroplating is continued until a desired thickness is formed on the substrate. For example, in the manufacture of printed circuit boards, a desired thickness may range from about 0.5 mils to about 2.0 mils, preferably from about 1.0 mils to about 1.5 mils. An electroplating time of from about 30 minutes to about 90 minutes is expected to obtain a deposit of the desired thickness within the above-mentioned ranges at the disclosed current density ranges.

Metal deposits formed by the process of the present invention are uniform in thickness and free of defects. Additionally, metal layers deposited on conductive surfaces of non-conductive substrates treated by the method of the present invention form a high integrity bond with the treated substrates. Bond strength is sufficient to withstand solder-shock testing as used in printed circuit board manufacture. Bond strengths between a deposited metal and a substrate treated using the cobalt etch may range from about 0.5 N/mm (Newtons/millimeter) to about 1.2 N/mm. More often the bond strength ranges from about 0.6 N/mm to about 0.8 N/mm.

Non-conductive substrates may be made from a variety of non-conductive materials, including resins such as thermoplastic, thermosetting and elastomeric polymers, and glass. The substrate may be a composite material, e.g., epoxy-glass, phenolic-paper, or polyester-glass; and composites used in printed circuit board manufacturing include polyimides for flexible circuitry or high-temperature applications; paper/phenolic that can be readily punched: NEMA grade FR-2; paper/epoxy that has improved mechanical properties than the paper/phenolic: NEMA grade FR-3; glass/epoxy and woven glass fabric that have good mechanical properties: NEMA grade FR-4, FR-5; and random glass/polyester that is suitable for some applications: NEMA grade FR-6. Examples of thermosetting polymeric materials that are suitable include polyepoxides; phenolic resins; aminoplastics; unsaturated polyesters; polyimides; and polyamides. Preferred thermosetting polymeric materials include the epoxy resins; phenolic resins, e.g., copolymers of phenol, resorcinol and cresol; and polyamides. Non-conductive substrates can be molded from such polymeric materials additionally containing fillers and/or reinforcing agents, such as glass filled epoxy or phenolic base materials. Other additives that may be present in the polymer include natural fibers such as cotton, paper and cellulose; synthetic fibers; carbon black; powdered alumina; fine silica particles; wax and the like, used as fillers, pigments, reinforcing agents, mold release agents, and the like. Suitable thermoplastic polymeric materials include polyolefins, such high and low density polyethylene, polypropylene, polyfluoroethylene, ethylene-propylene copolymers and the like; polysulfones; polysulfides including polyalkylene sulfides and polyarylene sulfides; polystyrenes and acrylonitrile-butadiene-styrene (ABS) copolymers; polyimides; polyesterimides; polyetherimides; polycarbonates; polyphenylene oxide; polyurethanes; and polyamideimides. Preferred thermoplastic polymeric materials are polyolefins, e.g., polypropylene; polysulfones; polycarbonates; and ABS copolymers.

Advantageously, the method of the present invention provides for a method of both texturing and providing an electrically conductive surface on a non-conductive substrate that may be immediately electroplated. Prior to etching the non-conductive substrate with the cobalt etch, the non-conductive substrate need not be treated with corrosive or harsh compounds such as chromic acid. Suprisingly, the cobalt etch textures the non-conductive substrate such that a high integrity bond between the substrate and a metal deposited on the substrate is formed. In addition to eliminating harsh and undesirable treatment steps, the method of the present invention eliminates the need to employ costly tin/noble metal catalysts as well as an electroless plating step. Thus, the method of the present invention is both cost effective, and provides for a shorter method of achieving direct metallization of a surface of a non-conductive substrate. Because the method of the present invention has a shortened duration in contrast to conventional methods of electroplating non-conductive substrates, the method of the present invention may be effectively employed in both vertical and horizontal methods of preparing multi-layer circuit boards.

The method of the present invention eliminates the need for such undesirable reducing agents such as formaldehyde and boron compounds. As discussed above, formaldehyde is carcinogenic and is hazardous to workers and presents waste disposal problems. Boron compounds are costly and thus are not economic. Accordingly, the method of the present invention provides an improvement over numerous methods of electroplating a non-conductive substrate.

The following examples are intended to illustrate the present invention and are not intended to limit the scope of the invention.

EXAMPLE 1

Three samples of acrylonitrile-butadiene-styrene (ABS) plastic (non-conductive substrate) coupons with a surface area of about 64 $cm^2$ were treated by three different methods to show that the method of the present invention is an improvement in the art. One coupon was treated with a chromic acid etch, a second coupon was treated according to the cobalt etch/direct plate method of the present invention, and the third coupon was treated by a cobalt etch/electroless method.

All the solutions employed were aqueous based. The electroless copper solution that was used composed copper in a concentration of about 2.0 g/L, sodium hydroxide at a concentration of about 7.8 g/L, formaldehyde at a concentration of about 3.0 g/L and ethylenediamine tetraacetic acid at a concentration of about 35 g/L. The electroplating bath for direct electroplating of copper was composed of about 19 g/L of copper, about 225 g/L of sulfuric acid and about 50 ppm of chloride. The catalyst employed in the standard chromic acid etch method was a tin/palladium colloidal catalyst.

The conditioner employed to treat the ABS plastic coupon that was etched with chromic acid was about 65% by weight of a dimethyl formamide solution. The conditioner for the remaining two coupons were composed of gamma butyrolactone, propylene carbonate, a non-ionic polyoxypropylene surfactant and a small amount of a phosphate ester surfactant to improve wetting characteristics.

The chromic acid etch was composed of about 90 g/L of chromic acid, about 30 g/L of sulfuric acid and about 20 g/L of phosphoric acid. The cobalt etch was composed of about 1M cobalt sulfate and about 1M sulfuric acid.

The sulfide solution employed in the method of the present invention was composed of about 10 g/L of $Na_2S_2O_4$, about 0.5 g/L $Na_2S$ $9H_2O$, and about 3.5 g/L of NaOH.

The neutralizer, accelerator and reducing agent employed were conventional.

The table below contrasts the time duration for each step of the three methods for preparing a non-conductive substrate for copper plating and depositing the copper on the activated substrate.

TABLE

| STANDARD CHROMIC ETCH | | | COBALT ETCH/DIRECT PLATE | | | COBALT ETCH/ELECTROLESS Cu | | |
| --- | --- | --- | --- | --- | --- | --- | --- | --- |
| Process Step | Time/min. | Temp./° C. | Process Step | Time/min. | Temp/° C. | Process Step | Time/min. | Temp/° C. |
| Conditioner | 2 | 38 | Conditioner | 5 | 38 | Conditioner | 5 | 38 |
| Water rinse | 2 | 20 | Water rinse | 2 | 20 | Water rinse | 2 | 20 |
| Chromic etch | 10 | 70 | Cobalt etch | 15 | 35 | Cobalt etch | 15 | 35 |
| Water rinse | 2 | 20 | Water rinse | 2 | 20 | Water rinse | 2 | 20 |
| Neutralizer | 2 | 40 | Sulfide | 5 | 25 | Reducing agent | 3 | 20 |
| Water rinse | 2 | 20 | Water rinse | 2 | 20 | Water rinse | 2 | 20 |
| Catalyst predip | 2 | 40 | Electrolytic plating | 15 | 20 | Electroless copper | 15 | 20 |
| Sn/Pd catalyst | 4 | 40 | | | | Electrolytic plating | 15 | 20 |

TABLE-continued

| STANDARD CHROMIC ETCH | | | COBALT ETCH/DIRECT PLATE | | | COBALT ETCH/ELECTROLESS Cu | | |
|---|---|---|---|---|---|---|---|---|
| Process Step | Time/min. | Temp./° C. | Process Step | Time/min. | Temp/° C. | Process Step | Time/min. | Temp/° C. |
| Water rinse | 2 | 20 | | | | | | |
| Accelerator | 3 | 30 | | | | | | |
| Water rinse | 2 | 20 | | | | | | |
| Electroless copper | 15 | 20 | | | | | | |
| Electrolytic plating | 15 | 20 | | | | | | |
| Process steps total time | 61 | | Process steps total time | 26 | | Process steps total time | 59 | |

As disclosed in the Table above, the process of the present invention took 26 minutes in contrast to the longer methods of the chromic acid method that took 61 minutes and the cobalt etch/electroless method that took 59 minutes. Thus, the method of the present invention is more than twice as fast and efficient in contrast to the other two treatment/plating methods. Accordingly, the method of the present invention is an improvement in preparing non-conductive substrates for direct metallization.

EXAMPLE 2

ABS panels with a surface area of about 16 cm were treated with a conditioner containing a mixture of butyrolactone and propylene carbonate with the addition of about 0.5 g/L of Triton® to make the coupons hydrophilic. The panels were treated for about 5 minutes at a temperature of about 40° C. The panels were then rinsed with water for about 2 minutes and then placed into an aqueous cobalt etch solution for about 15 minutes at a temperature of about 35° C. The cobalt etch solution was composed of 1M $CoSO_4$ in 1M $H_2SO_4$. A current of about 0.2 amps was passed through the etching solution during treatment of the panels (platinum electrodes with a surface area of about 12 $cm^2$ were used). The panels were then dipped into water to remove excess cobalt and then treated in a sulfide solution for about 5 minutes at about 25° C. The sulfide solution contained about 10 g/L of $Na_2S_2O_4$, about 2% by weight $Na_2S$ $9H_2O$ and about 1% by weight of NaOH. The panels were rinsed with water for about 2 minutes then directly electroplated with copper in a copper electroplating bath. The copper electroplating bath contained about 19 g/L of copper, about 224 g/L of sulfuric acid and about 50 ppm of chloride. Uniform copper metal layers were observed on all of the panels.

A SEM of each panel was taken after treating the panels with the cobalt etch. Each SEM showed a porous surface substantially as shown in FIG. 1.

Accordingly, the combined adhesion promotion and direct metallization method of the present invention provided good texturing of an ABS polymer material as well as an efficient method for directly electroplating the ABS polymer material.

EXAMPLE 3

Panels composed of polyester fabric and panels composed of polymer coated paper were placed in an aqueous cobalt etch solution at about 35° C. with a current of about 0.2 amps passing through the solution (platinum electrodes with a surface area of about 12 $cm^2$ were used). The cobalt etch solution contained 1 M $CoSO_4$ in 1M $H_2SO_4$. After etching, the panels were briefly rinsed with water and then treated in a sulfide solution composed of about 10 g/L of $Na_2S_2O_4$, about 2% by weight of $Na_2S$ $9H_2O$ and about 1% by weight of NaOH for about 5 minutes. Each panel was rinsed with water and then directly electroplated with copper. The copper electroplating bath contained about 19 g/L of copper, about 225 g/L of sulfuric acid and about 50 ppm of chloride. A uniform copper layer was formed on each panel.

After each panel was etched with cobalt, a SEM was taken of each panel. Each panel showed a porous surface substantially as shown in FIG. 1.

Accordingly, the combination cobalt etch and direct plating method of the present invention provided good texturing of a polymer material and an efficient direct electroplating method for metal on a polymer.

What is claimed is:

1. A method for direct metallization of a non-conductive substrate comprising:
    a) etching the non-conductive substrate with a cobalt etch solution to texture the non-conductive substrate such that the non-conductive substrate is made porous; then
    b) applying a sulfide to the porous non-conductive substrate to provide a conductive surface on the porous non-conductive substrate; and then
    c) metallizing the conductive and porous surface of the non-conductive substrate by direct electroplating.

2. The method of claim 1, wherein direct metallization of the conductive and porous surface of the non-conductive substrate is performed with a metal comprising copper, nickel, tin, lead, iron, gold, silver, platinum, palladium, tantalum, cobalt, ruthenium, indium, bismuth, antimony, rhodium, vanadium, zinc or alloys thereof.

3. The method of claim 1, wherein the cobalt etch is performed for about 5 minutes to about 60 minutes.

4. The method of claim 1, wherein the sulfide application is from about 30 seconds to about 10 minutes.

5. The method of claim 1, wherein the cobalt etch comprises a mixture about 5 g/L to about 120 g/L of cobalt (II) ions and cobalt (III) ions.

6. The method of claim 1, wherein the cobalt etch contains acids comprising sulfuric acid, nitric acid, tetrafluoroboric acid, phosphoric acid or mixtures thereof.

7. The method of claim 1, wherein the sulfide comprises a monosulfide, disulfide, tetrasulfide, polysulfide or mixtures thereof.

8. The method of claim 1, wherein the sulfide is applied as an aqueous alkaline solution comprising a dithionite having the general formula $M_2S_2O_4$, where M comprises sodium, potassium or lithium.

9. The method of claim 8, wherein the dithionite comprises from about 1.0 g/L to about 15 g/L of the solution.

10. The method of claim 1, further comprising the step of conditioning the non-conductive substrate with a conditioner or solvent swell to make the non-conductive substrate hydrophilic prior to the etching.

11. A method for direct metallization of a non-conductive substrate consisting of:
   a) conditioning a non-conductive substrate to make the non-conductive substrate hydrophilic;
   b) optionally rinsing the hydrophilic non-conductive substrate with an aqueous wash;
   c) texturing the hydrophilic non-conductive substrate with a cobalt etch to make a surface of the non-conductive substrate porous;
   d) optionally rinsing the porous surfaced non-conductive substrate with an aqueous wash;
   e) applying a sulfide to the porous surfaced non-conductive substrate to provide a conductive and porous surface on the non-conductive substrate;
   f) optionally rinsing the conductive and porous surfaced non-conductive substrate; and
   g) metallizing the conductive and porous surface of the non-conductive substrate by direct electroplating.

12. The method of claim 11, wherein the non-conductive substrate is made hydrophilic with a conditioner or solvent swell with a pH of from about 6.5 to less than about 8.0.

13. The method of claim 12, wherein the non-conductive substrate is made hydrophilic with a conditioner comprising gamma butyrolactone, propylene carbonate, a non-ionic polyoxypropylene surfactant, and a phosphate ester surfactant.

14. The method of claim 12, wherein the non-conductive substrate is made hydrophilic with a solvent swell comprising a ketone, lactone, heterocyclic nitrogen compound, glycol, glycol ether, or mixtures thereof.

15. The method of claim 11, wherein the cobalt etch is performed for about 5 minutes to about 60 minutes.

16. The method of claim 11, wherein the cobalt source of the cobalt etch comprises cobalt halides, cobalt sulfates, cobalt nitrates, cobalt tetrafluoroborates, or mixtures thereof.

17. The method of claim 11, wherein the sulfide is in an aqueous alkaline solution comprising a dithionite having the formula $M_2S_2O_4$, where M is sodium, potassium, or lithium.

18. The method of claim 11, wherein the conductive surface of the non-conductive substrate is metallized by direct electroplating a metal on the conductive surface.

19. The method of claim 11, wherein the metal plated on the conductive surface is copper or nickel.

20. The method of claim 11, wherein a bond strength between the metal and the conductive surface of the non-conductive substrate comprises from about 0.5 N/mm to about 1.2 N/mm.

* * * * *